United States Patent
Ansell

(10) Patent No.: US 9,640,370 B2
(45) Date of Patent: May 2, 2017

(54) ETCHING APPARATUS AND METHODS

(71) Applicant: SPTS TECHNOLOGIES LIMITED, Ringland Way, Newport (GB)

(72) Inventor: Oliver James Ansell, Berkeley (GB)

(73) Assignee: SPTS Technologies Limited, Newport (GB)

( * ) Notice: Subject to any disclaimer, the term of this patent is extended or adjusted under 35 U.S.C. 154(b) by 337 days.

(21) Appl. No.: 14/195,887

(22) Filed: Mar. 4, 2014

(65) Prior Publication Data

US 2014/0174658 A1 Jun. 26, 2014

Related U.S. Application Data

(62) Division of application No. 13/674,482, filed on Nov. 12, 2012, now Pat. No. 8,709,268.

(60) Provisional application No. 61/559,252, filed on Nov. 14, 2011.

(51) Int. Cl.
  *H01J 37/32* (2006.01)
  *H01L 21/66* (2006.01)
  *B81C 99/00* (2010.01)

(52) U.S. Cl.
  CPC .. *H01J 37/32963* (2013.01); *H01J 37/32972* (2013.01); *H01L 22/26* (2013.01); *B81C 99/0065* (2013.01); *B81C 2201/0135* (2013.01); *B81C 2201/0142* (2013.01)

(58) Field of Classification Search
  CPC .......... H01J 37/32963; H01J 37/32972; H01L 22/26; B81C 99/0065; B81C 2201/0135; B81C 2201/0142
  USPC ........... 156/345.24, 345.25, 345.28; 118/715
  See application file for complete search history.

(56) References Cited

U.S. PATENT DOCUMENTS

| | | | | |
|---|---|---|---|---|
| 5,728,253 A | * | 3/1998 | Saito | B81C 1/00587 118/712 |
| 6,509,960 B2 | * | 1/2003 | Johnson | G01N 21/55 216/60 |
| 8,045,145 B1 | * | 10/2011 | Bakker | G01N 21/95607 356/237.1 |
| 2004/0069747 A1 | * | 4/2004 | Patel | H01J 37/32449 216/59 |
| 2004/0207836 A1 | * | 10/2004 | Chhibber | G01N 21/4738 356/237.4 |

(Continued)

FOREIGN PATENT DOCUMENTS

| | | |
|---|---|---|
| EP | 0653621 A1 | 11/1994 |
| JP | H03196625 A | 8/1991 |

(Continued)

OTHER PUBLICATIONS

Japanese Office Action in Related Japanese Appication No. 2012-250063 Dated Nov. 24, 2016.

*Primary Examiner* — Rudy Zervigon

(74) *Attorney, Agent, or Firm* — Volentine & Whitt, PLLC

(57) ABSTRACT

A method is for etching the whole width of a substrate to expose buried features. The method includes etching a face of a substrate across its width to achieve substantially uniform removal of material; illuminating the etched face during the etch process; applying edge detection techniques to light reflected or scattered from the face to detect the appearances of buried features; and modifying the etch in response to the detection of the buried feature. An etching apparatus for etching substrate across its width to expose buried is also disclosed.

12 Claims, 10 Drawing Sheets

Example of camera and illuminating positioning

(56) References Cited

U.S. PATENT DOCUMENTS

| | | | |
|---|---|---|---|
| 2005/0011611 A1* | 1/2005 | Mahoney | H01J 37/32935 156/345.24 |
| 2005/0020073 A1 | 1/2005 | Perry | |
| 2005/0264796 A1* | 12/2005 | Shaw | G01B 11/162 356/237.2 |
| 2006/0191865 A1* | 8/2006 | Nishimura | H01L 21/31055 216/58 |
| 2008/0032429 A1* | 2/2008 | Chen | G01N 21/8851 438/14 |
| 2009/0139576 A1* | 6/2009 | Crenshaw | B01F 5/0646 137/3 |
| 2013/0137195 A1* | 5/2013 | Ansell | H01L 22/26 438/9 |
| 2015/0235368 A1* | 8/2015 | Kakuma | G06T 7/0042 348/135 |
| 2016/0045841 A1* | 2/2016 | Kaplan | B01J 19/0093 429/49 |

FOREIGN PATENT DOCUMENTS

| | | | |
|---|---|---|---|
| JP | 2001319922 A | 11/2001 | |
| JP | 2001332534 A | 11/2001 | |
| JP | 2003004644 A | 1/2003 | |
| JP | 2005159008 A | 6/2005 | |
| JP | 2010010242 A | 1/2010 | |
| JP | 2010519772 A | 6/2010 | |
| WO | WO99/23472 A1 | 5/1999 | |

* cited by examiner

Example of camera and illuminating positioning

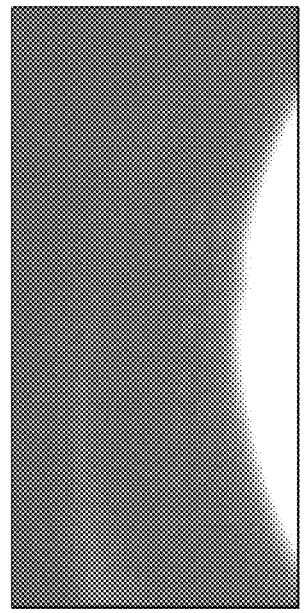
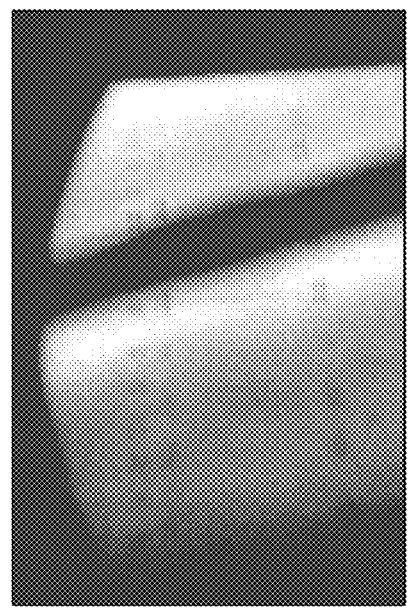
Fig. 5(a)   Fig. 5(b)
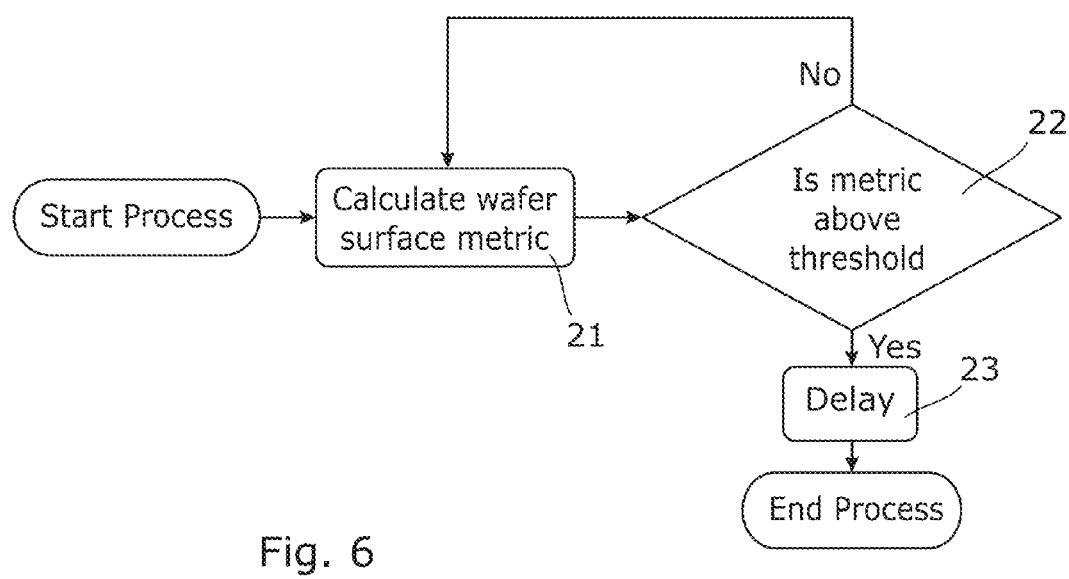
Fig. 6

Graph showing the metric of average intensity within a region of interest during a process. This data was taken from a region of interest of approx 3cm x 2cm in the centre of a 200mm diameter wafer. Representative images are shown below.

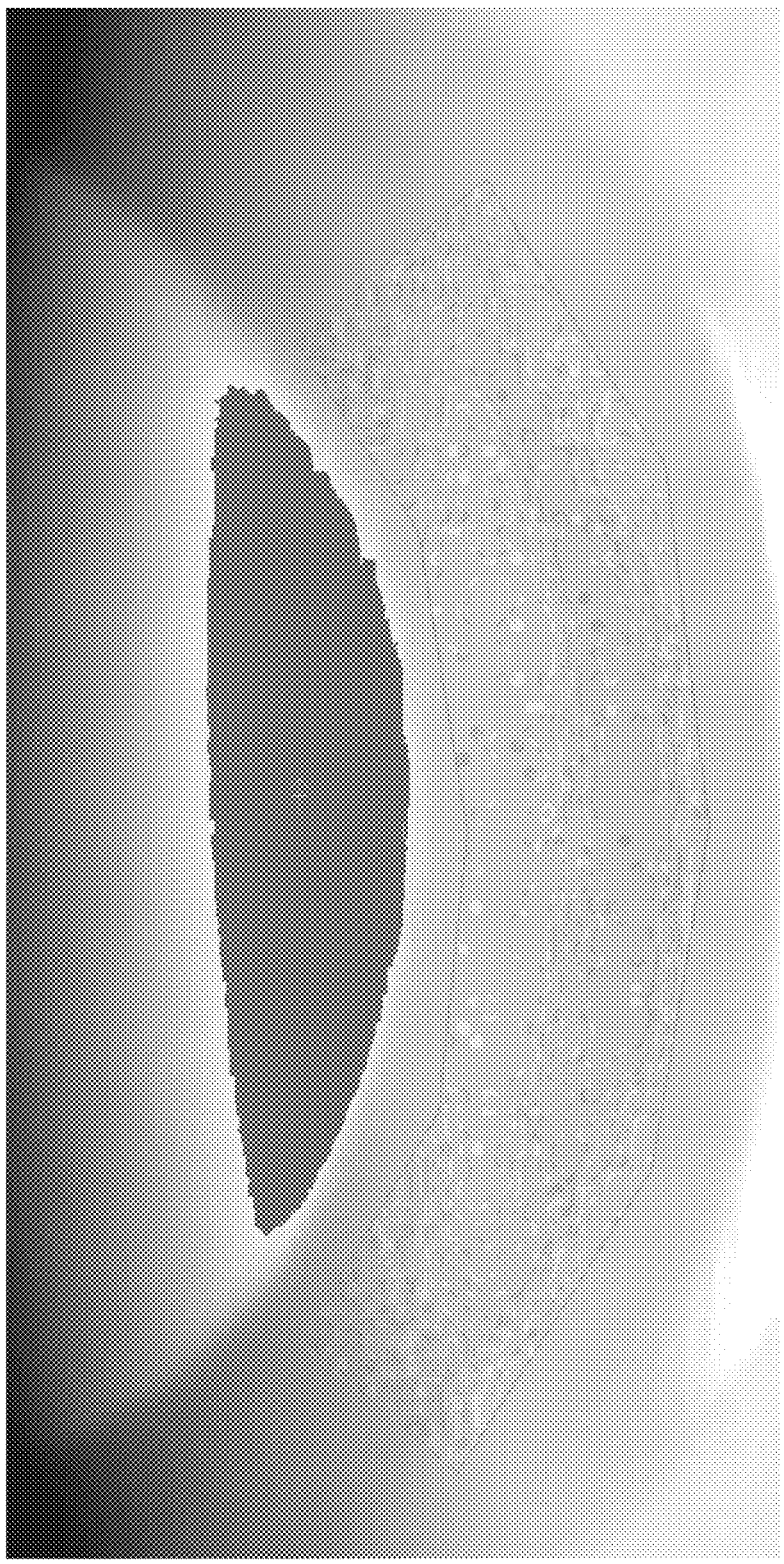
Fig. 8(a) Processed image before endpoint

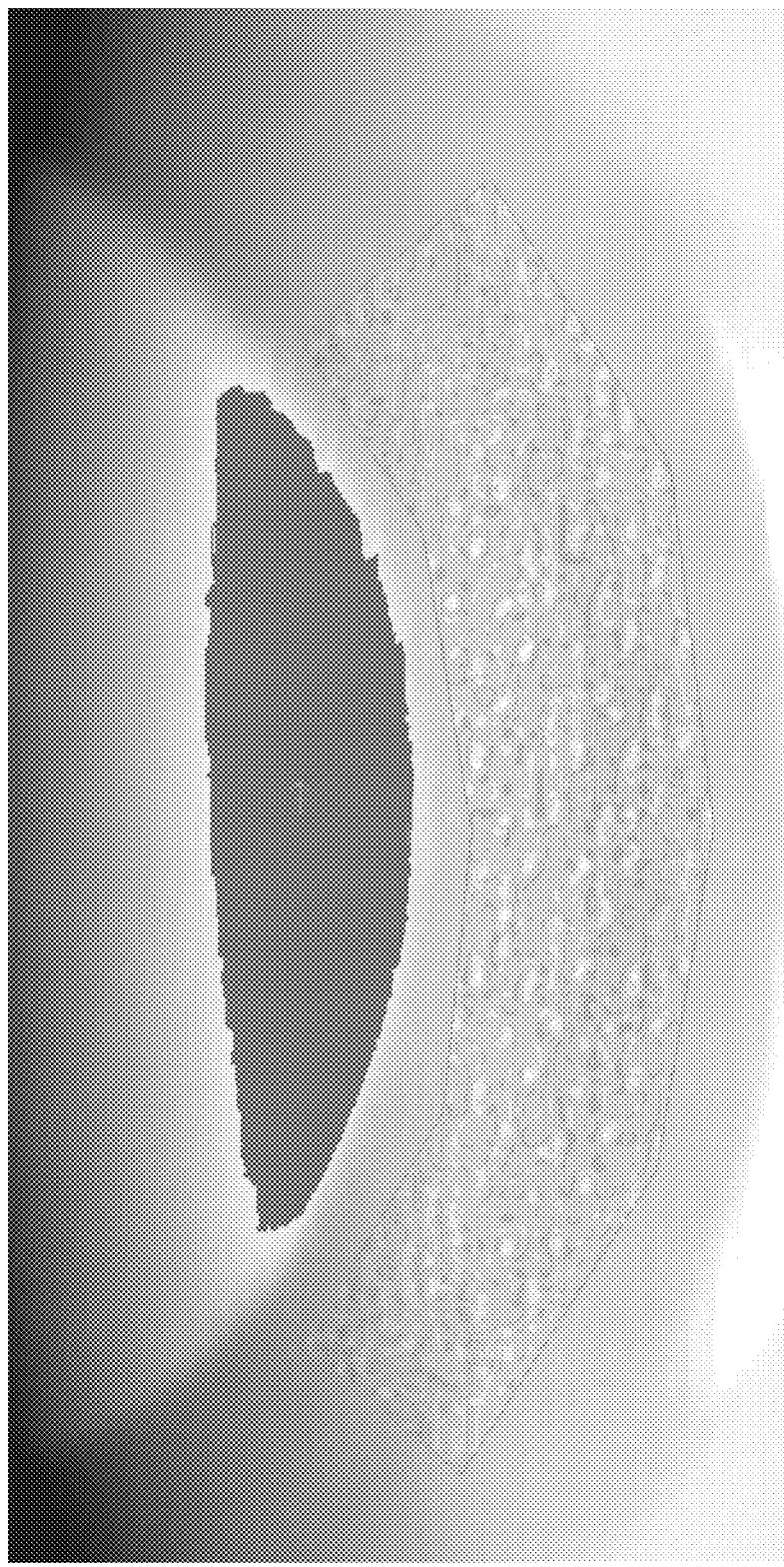
Fig. 8(b) Processed image after endpoint

Raw image after endpoint

ETCHING APPARATUS AND METHODS

CROSS-REFERENCE TO RELATED APPLICATIONS

This is a Divisional of U.S. non-provisional patent application Ser. No. 13/674,482, filed Nov. 12, 2012, the disclosure of which is incorporated herein by reference, and issued on Apr. 29, 2014 as U.S. Pat. No. 8,709,268.

BACKGROUND

This invention relates to apparatus and methods for uniformly removing material across the whole width of a substrate by plasma etching to expose the ends of buried, filled vias or other buried features.

The problem of end point detection is well known in the plasma etch industry and various techniques have been developed to detect the point at which a substrate has been etched to the desired depth, so that the etch process can be halted. In typical applications, features are etched through a mask layer into the underlying layer or layers. The detection of the end point (the reaching of the desired etch depth) tends to be based on two distinct technologies. In one, the apparatus or operator is looking for a change in chemistry at the point at which the etch breaks through from one layer to another. This may arise from a change in the chemistry of the actual layers built up in the device or thin etch stop layer may be deliberately deposited between two layers so as to induce a change in chemistry. In early days the etch was simply carried on for a fixed time. More sophisticated and faster techniques have been developed over the years. The second technique is based on reflectometry or interferometry which rely on the upper surface of the substrate (e.g. the hard mask) forming a reference surface against which the depth of the etched structure may be judged.

Recently, 3-D device integration schemes have started to produce new challenges for process equipment. A possible process and equipment flow is shown in FIG. 1, which is Figure EP17 from the assembly and packaging section of the 2009 edition of the ITRS (International Technology Roadmap for Semiconductors). This illustrates the progressive development of the device and, in the highlighted part of the sequence, calls for sequential thinning. In this step a device in which filled vias had been formed is inverted so that the backside of the substrate can be removed down to the level of the tops of the filled vias or other buried feature.

Traditionally, this might all have been done by chemical mechanical polishing but there are advantages in performing the later stages of the step using a plasma etch process. US-B2-7416648 is an example of such a process. However, because the substrate is etched across its width, there is no reference surface by means of which reflectometry or interferometry could be used. Equally, the buried features are so small (typically 10 µm diameter), and form such a small part of the total area of the etch face, that any change in chemistry is too small to detect. The whole top surface etching process is schematically illustrated in FIG. 2. If the thickness of material above the buried features is significant, then it may be convenient to use chemical mechanical polishing until quite close to the expected positions of the tips of the buried features, e.g. within 10 µm and then to etch. FIG. 2(a) is illustrative of a pre-etch situation.

SUMMARY

From one aspect the invention consists in a method of etching the whole width of a substrate, typically in the absence of a masking layer, to expose the ends of buried features, e.g. filled vias, including:
(a) etching the face of a substrate across its width to achieve substantially uniform removal of material;
(b) illuminating the etched face during the etch process;
(c) detecting non-homogeneity in an image of the face represented by light reflected or scattered from the face to detect the exposure of the buried features; and
(d) modifying the etch in response to the detecting of the buried features.

From a second aspect, the invention consists in a method of etching the whole width of a substrate to expose buried features, (e.g. filled vias) including:
(a) etching the face of a substrate across its width to achieve substantially uniform removal of material;
(b) illuminating the etched face during the etch process;
(c) applying edge detection techniques to light reflected or scattered from the face to detect the appearance of the buried features; and
(d) modifying the etch in response to the detection of the buried features.

It will be understood that in each of these processes the problems of the lack of reference surface and the lack of significant plasma chemistry change have been overcome.

The step of modifying the etch includes changing the process conditions or stopping the etch.

It is particularly preferred that the etch face is illuminated at an acute angle and in either case step (c) may include using a camera to capture the reflected or scattered light for producing an output signal and an edge detector filter for detecting the appearance of edges from the camera output signal.

The camera may be positioned for receiving light reflected or scattered at an acute angle.

The edge detector filter may be a Sobel filter.

From a further aspect the invention consists in etching apparatus for etching a substrate across its width to expose buried features, (e.g. filled vias) including:
(a) an etch chamber for etching a substrate;
(b) a support for a substrate for retaining the substrate in a generally horizontal position with a face to be etched exposed;
(c) an illumination source mounted at an acute angle with respect to the support for illuminating the face;
(d) a camera for capturing light reflected or scattered from the face at an acute angle;
(e) an edge detector coupled to the camera for detecting the appearance of at least one edge on the face; and
(f) a controller for controlling the etch operation of the chamber and stopping the etch in response to the detection of an edge.

The edge detector may utilise a Sobel filter.

It will be understood that the edge detector could be replaced by any suitable non-homogeneity detector for detecting non-homogeneity in the appearance of the face. However due to the orthogonal arrangement used in the lay-out of vias on a wafer the use of a Sobel filter or filters is particularly useful for edge detection.

Although the invention has been defined above it is to be understood it includes any inventive combination of the features set out above or in the following description.

BRIEF DESCRIPTION OF THE DRAWINGS

The invention may be performed in various ways and is a specific embodiment will now be described, by way of example, with reference to the accompanying drawings, in which:

FIGS. 5(a) and 5(b) show processed images from reflected light and scattered light respectively;

FIG. 6 is a schematic flow diagram of an embodiment of the Applicants' process;

FIGS. 8(a), 8(b) and 8(c) are respectively a processed image before the end point, a processed image after the end point and a raw image after the end point.

DETAILED DESCRIPTION OF EMBODIMENTS

Figure 4A:
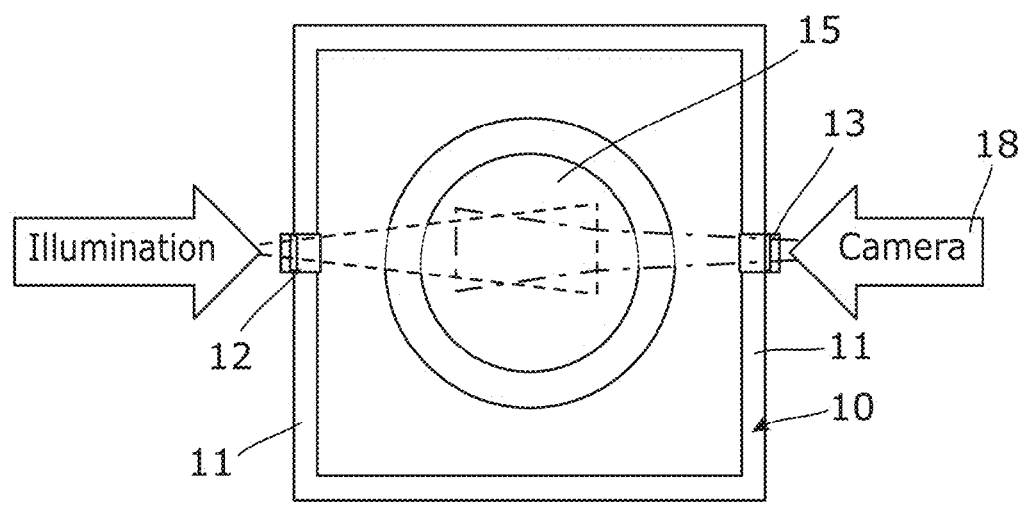
FIGS. 4(a) and 4(b) are schematic plan and side views of an apparatus illustrating possible illumination and camera positions.
Figure 4B:
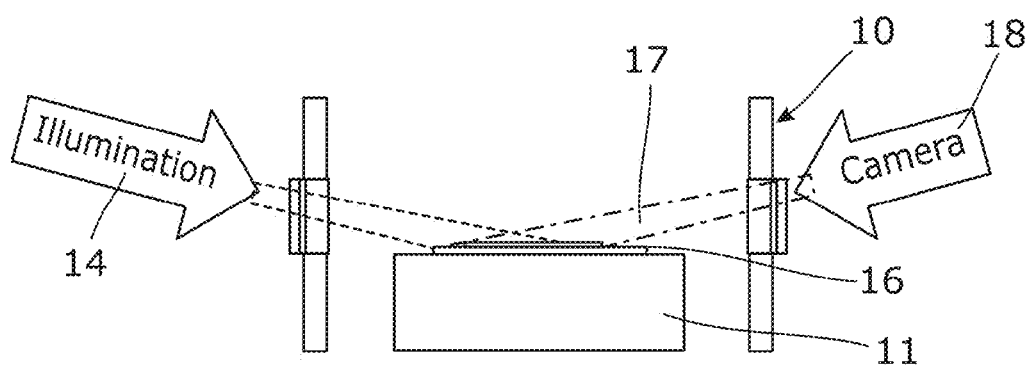

FIGS. 4 (a) and (b) show, schematically, a part of an etch chamber 10, which encloses a substrate support 11. The construction and operation of such chambers is well known to persons skilled in the art and will not be described here other than is necessary for an understanding of the invention.

Windows 12, 13 are formed in respective opposed walls 11 of the chamber 10. An illumination source 14 illuminates a part of the surface of an exposed face 15 of the substrate 16. Scattered radiation 17 passes to a camera 18 through the window 13 and is detected by the camera 18.

Figure 1:
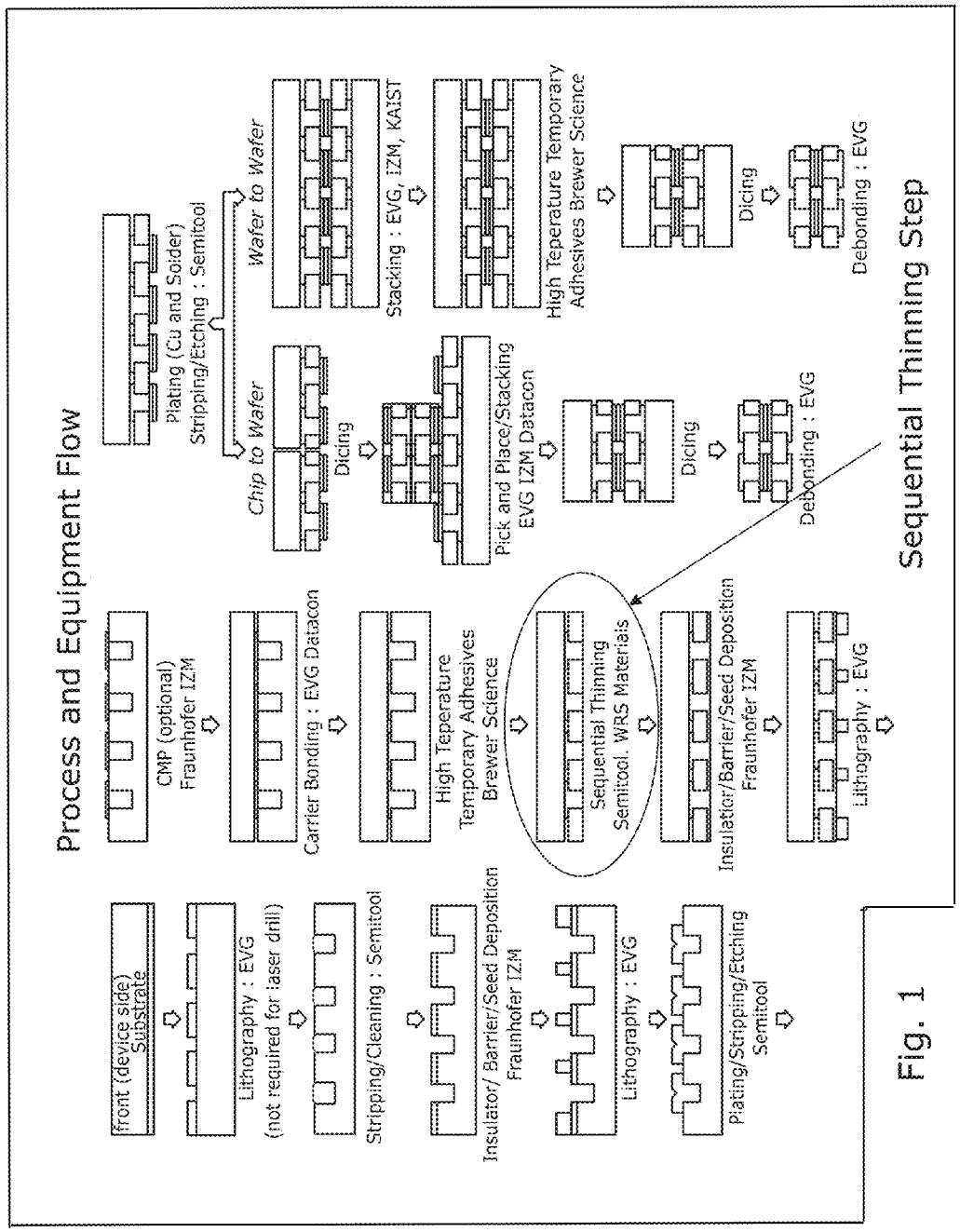
FIG. 1 is a process and equipment flow as described above.
Figure 2B:
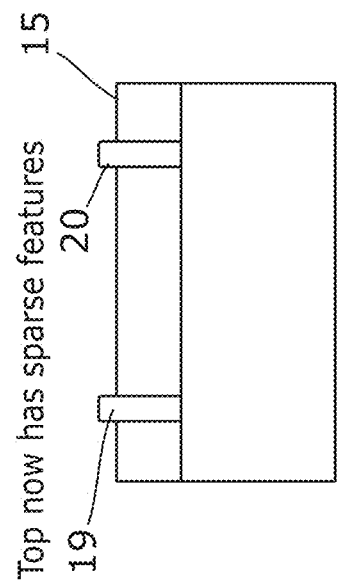
FIGS. 2a and 2b are schematic diagrams showing the etch process to be performed.
Figure 2A:
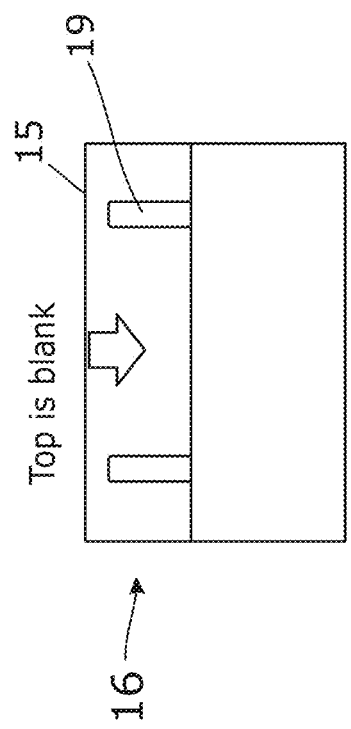

There are a large number of image detection techniques which could be used to distinguish successive images detected by the camera to determine the change of the face 15 from a homogeneous face to non-homogeneous face, as a result of the appearance of the upper surfaces of buried features. For simplicity these features will be treated as being filled vias for the rest of this description. These are for example illustrated at 19 in FIGS. 2(a) and (b). However, in a number of such detection techniques the pixel size of the camera would need to be less than the surface area of the exposed buried feature. As the buried features are typically 10 μm in diameter this is technologically demanding and requires an extremely expensive camera. Accordingly, in particular embodiments the Applicants have appreciated that they can avoid the need for this pixel size limitation by using edge detection techniques, such as a Sobel filter.

Figure 3A:
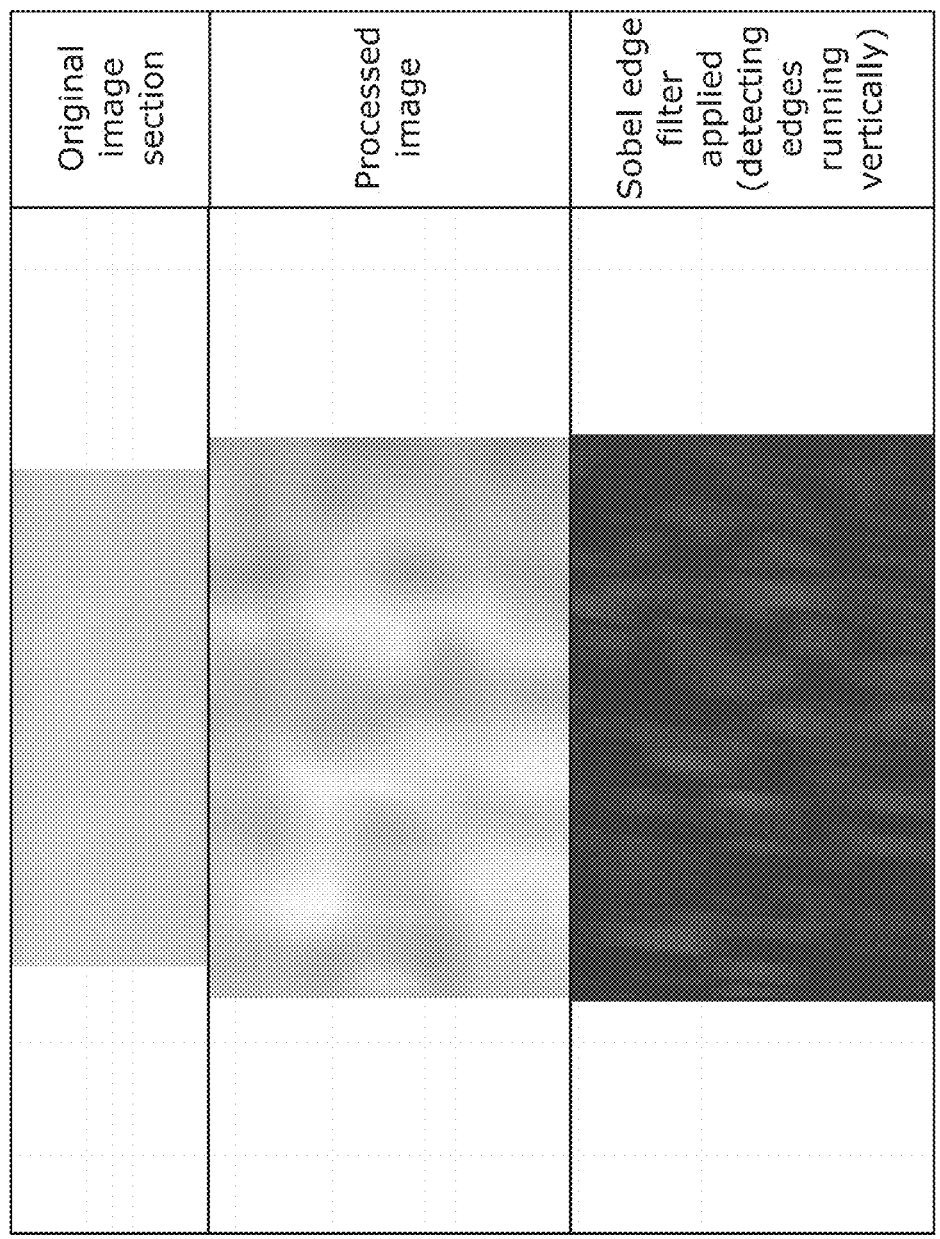
FIG. 3(a) shows an original image from a camera of the Applicants' apparatus showing a surface in which buried features have been exposed, the surface image after etching, and the image after Sobel edge filter has been applied.
Figure 3B:
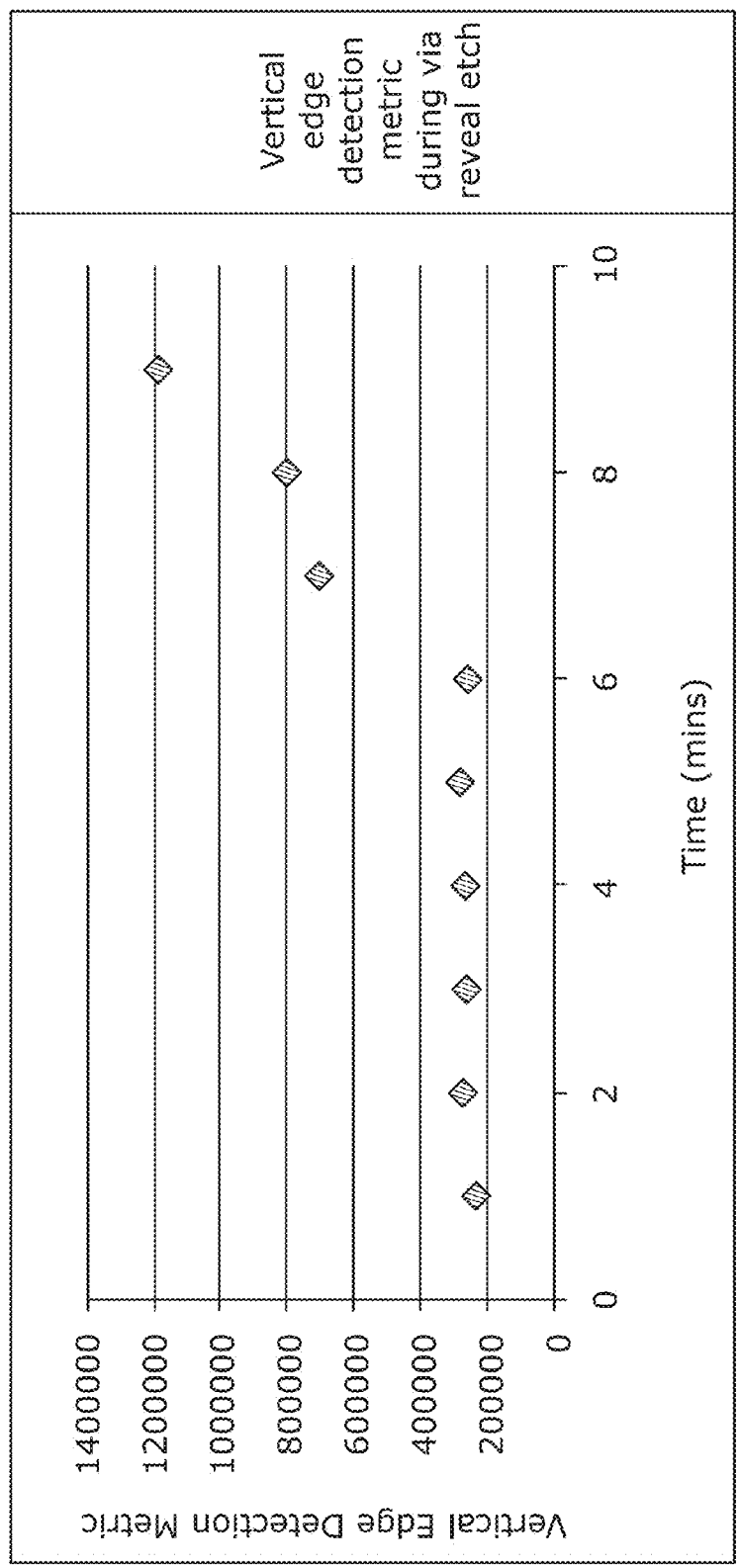
FIG. 3(b) shows the change in intensity signal of the vertical edge detection as a function of etch time.

The advantages of this can be seen in FIGS. 3(a) and 3(b). FIG. 3(a) shows the basic image of the illuminated section of the face 15, an image of an etched feature which has been enlarged and contrast enhanced, and the image after it has been processed by a Sobel edge filter. It will be apparent that the detected vias are now significantly more visible and the resultant change in intensity in the Sobel filter is enhanced because the buried features are aligned.

Sobel filters are well known in the art but for ease of understanding of the present invention they utilise a Sobel operator which is a discrete differentiation operator, computing an approximation of the gradient of the image intensity function. In practice they apply to sequence a vertical and horizontal filter to an image. The intensities of the images are then processed to enhance the appearance of the edges of the features in the image. Preferably this sequence is carried out throughout the etch process. This is illustrated for the region of the wafer for which the images in FIG. 3(a) are taken by the graph shown in FIG. 3(b). The section for the first six minutes of etch shows no significant change in intensity of the vertical edge detection signal because the surface is homogeneous and then after six minutes the graph rises due to the appearance of buried features creating changes in the intensity gradient in the image. This change in gradient can be used as an etch end-point signal.

FIGS. 5(a) and (b) illustrate processed images where the light is scattered (i.e. the light source is opposite the camera) or reflected (i.e. the light source is transmitted from the same side as the camera). When the light is reflected, the features show brighter than the background as in FIG. 5(a), whereas when it is scattered they are darker than the background as in FIG. 5(b).

Positioning the camera at a shallow angle to the wafer means that the topography of the wafer is enhanced in the image relative to viewing directly from above. In a simplistic way one might see the slightly exposed tips 20 of the filled vias 19 as casting individual shadows. The more inclined the illumination, the greater the length of the shadow and the increased changed in the intensity gradient.

FIG. 6 illustrates schematically the process. Thus the process is started and the camera is monitored as a function of time. The light incident on the camera passes through the Sobel filter 21 to produce an enhanced image. The output signal of the Sobel filter 24 is fed to a comparator 22. If the filter output is above a preset threshold then the comparator feeds a signal to a delay 23, which then either stops or modifies the process.

Components 22 and 23 will usually form part of the controller for the etch apparatus.

Figure 7:
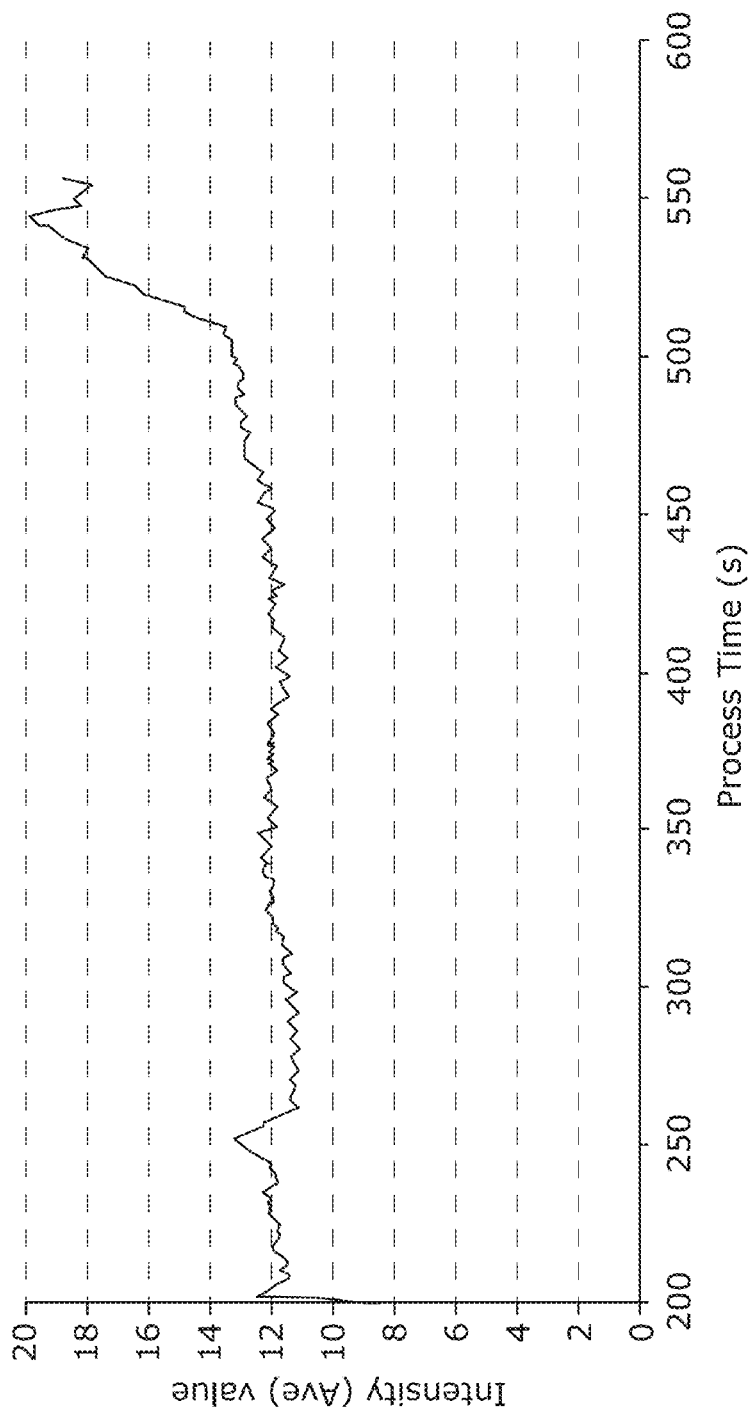
FIG. 7 shows the average intensity in the region of interest on the face during the process for the output of the Sobel filter.

This method is further illustrated in FIG. 7, which shows the average intensity of the camera output within a region of interest during the process. This sharp rise in average intensity after around 500 seconds illustrates the appearance of exposed vias.

Figure 8C:
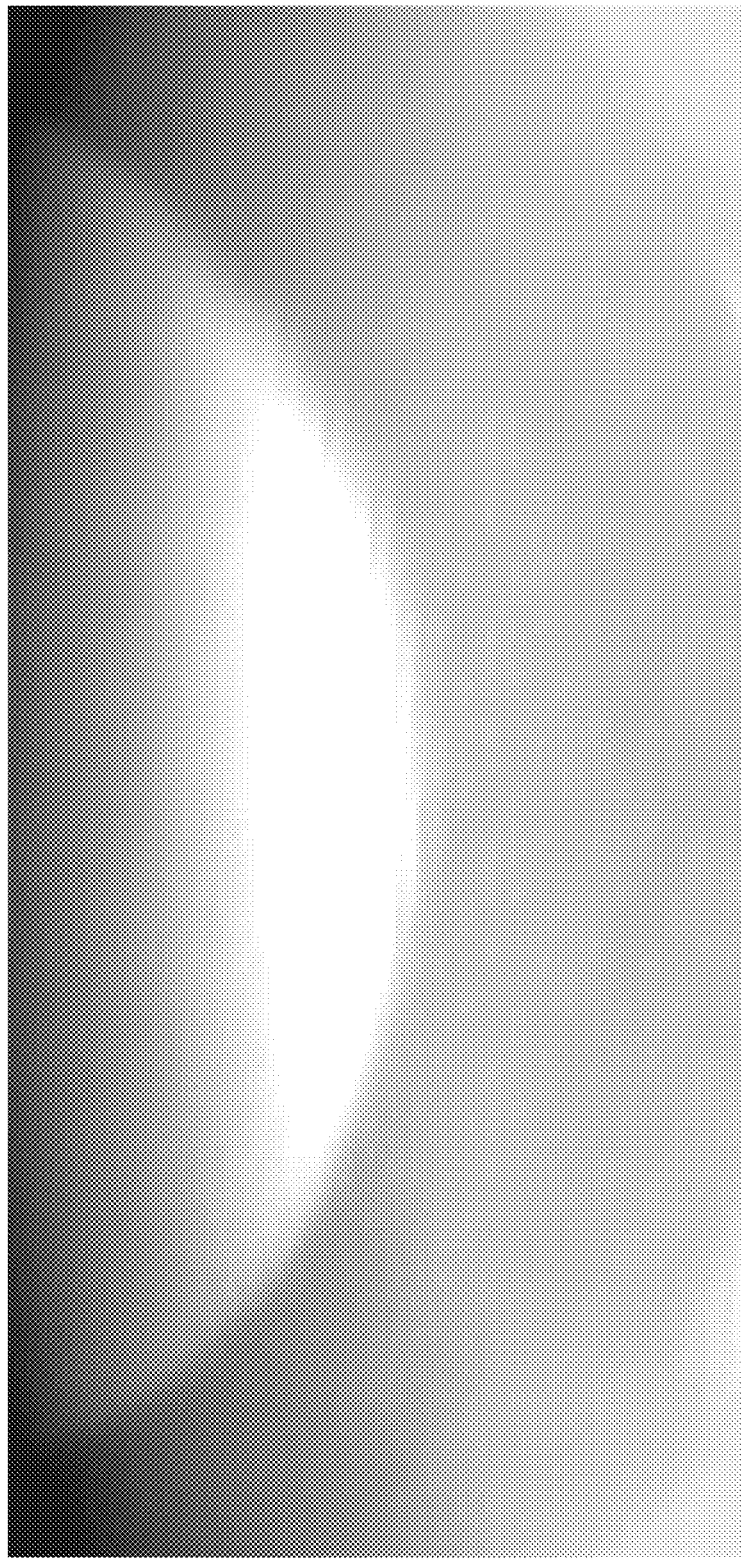

Further images are provided in FIG. 8. FIG. 8(a) shows a processed image before the end point; FIG. 8(b) shows a processed image after the end point in which a series of aligned features, approximately 30° from the horizontal, can be readily detected and FIG. 8(c) shows the corresponding raw image from which the processed image of FIG. 8(b) has been prepared.

It will be understood that the Applicants' approach overcomes the loss of a reference surface and the lack of significant changes in plasma chemistry and, in the use of edge detectors, enables a particularly economic end point detection process and apparatus to be achieved.

What is claimed is:

1. Etching apparatus for performing an etch operation of globally etching a substrate across its width to expose buried features, including: (a) an etch chamber; (b) a support fixed in place within the etch chamber and dedicated to retain the substrate in the etch chamber, the support having a support surface oriented horizontally such that when the substrate is generally planar and is retained by the support, a face of the substrate to be etched is oriented horizontally generally parallel to the support surface; (c) an illumination source having an optical axis and which emits light propagating in the direction of the optical axis, the illumination source being mounted in the apparatus as oriented relative to the support such that the optical axis of the illumination source extends at an acute angle with respect to the support surface and light emitted by the illumination source will illuminate the face of the substrate, retained by the support on the support surface, at an acute angle with respect to the face; (d) a camera positioned relative to the support to capture light reflected or scattered from the face at an acute angle with respect to the support surface; (e) an edge detector coupled to the camera and configured to detect the appearance of an edge of at least the buried features emerging on the face during the etch operation, and (f) a controller operatively connected to the edge detector and configured to stop the etch operation in response to the appearance of the at least one edge of the buried feature when detected by the edge detector.

2. Apparatus as claimed in claim 1, wherein the edge detector includes a Sobel filter.

3. Apparatus as claimed in claim 1, wherein the etch chamber has opposed walls and windows in the opposed walls, respectively.

4. Apparatus as claimed in claim 3, wherein the illumination source comprises a light source external to the etch chamber and positioned to generate light that passes through one of the windows.

5. Apparatus as claimed in claim 3, wherein the camera is external to the etch chamber and positioned to receive the reflected or scattered light through one of the windows.

6. Apparatus as claimed in claim 1, wherein the controller comprises a comparator.

7. Apparatus as claimed in claim 1, wherein the controller comprises a delay.

8. Apparatus as claimed in claim 1, wherein the illumination source and the camera are external to the etch chamber.

9. Apparatus as claimed in claim 8, wherein the illumination source and the camera are fixed in place in the apparatus relative to the etch chamber.

10. Apparatus as claimed in claim 1, wherein the edge detector is configured to detect the appearance of an edge of a surface having a diameter of 10 μm in or less.

11. Apparatus as claimed in claim 10, wherein the edge detector includes a Sobel filter.

12. Apparatus as claimed in claim 10, wherein the camera has pixels that are of a size too large to capture an image of a surface smaller than 10 μm in diameter.

\* \* \* \* \*